United States Patent [19]
Dannels et al.

[11] Patent Number: 5,833,609
[45] Date of Patent: Nov. 10, 1998

[54] ROTATING DIFFUSION MR IMAGING REDUCED MOTION ARTIFACTS

[75] Inventors: Wayne R. Dannels, Richmond Heights; Yansun Xu, Willoughby Hills, both of Ohio; Haiying Liu, Minneapolis, Minn.

[73] Assignee: Picker International, Inc., Highland Heights, Ohio

[21] Appl. No.: 753,543

[22] Filed: Nov. 26, 1996

[51] Int. Cl.$^6$ .................................................... A61B 5/055
[52] U.S. Cl. .......................... 600/410; 324/306; 324/309; 600/419
[58] Field of Search .............................. 128/653.2, 653.3; 324/307, 309, 306; 600/410, 419

[56] References Cited

U.S. PATENT DOCUMENTS

| | | | |
|---|---|---|---|
| 4,809,701 | 3/1989 | Le Bihan et al. ....................... | 128/653 |
| 5,492,123 | 2/1996 | Edelman ............................... | 128/653.2 |
| 5,539,310 | 7/1996 | Basser et al. ........................... | 324/307 |
| 5,539,311 | 7/1996 | Takiguchi et al. ...................... | 324/309 |
| 5,627,469 | 5/1997 | Hong et al. ............................ | 324/309 |
| 5,684,400 | 11/1997 | Tsukamoto et al. . | |
| 5,685,304 | 11/1997 | Tsukamoto . | |

FOREIGN PATENT DOCUMENTS 07313487   5/1995   Japan .

OTHER PUBLICATIONS

"Spin Diffusion Measurements: Spin Echoes in the Presence of a Time–Dependent Field Gradient", Stejskal, et al., Journal of Chemical Physics, vol. 42, No. 1, pp. 288–292, (1 Jan. 1965).

"MR Imaging of Anisotropically Restricted Diffusion of Water in the Nervous System: Technical, Anatomic, and Pathologic Considerations", Hajnal, et al. Journal of Computer Assisted Tomography, 15(1): 1–18, 1991.

"Analysis and Correction of Motion Artifacts in Diffusuin Weighted Imaging", Anderson, et al., MRM 32:379–387 (1994).

(List continued on next page.)

Primary Examiner—Marvin M. Lateef
Assistant Examiner—Shawna J. Shaw
Attorney, Agent, or Firm—Fay, Sharpe, Beall, Fagan, Minnich & McKee

[57] ABSTRACT

Within a selected slice or slab, diffusion sensitizing gradients (54, 56) and read gradients (66, 68) are induced along each of a pair of orthogonal axes ($G_x$, $G_y$). The motion sensitizing gradient pulses sensitize excited magnetic resonance to diffusion in a preselected diffusion direction (D) which is orthogonal to a selected read gradient direction. The diffusion sensitizing gradients are rotated by $\sin(\theta+\pi/2)$ and $\cos(\theta+\pi/2)$ and the read gradients are rotated by $\sin\theta$ and $\cos\theta$ to generate a plurality of angularly displaced data lines. The diffusion sensitivity direction remains perpendicular to the read direction in each of the angularly displaced data lines. The phase of each data line is determined (90) and shifted (94) to compensate for linear translations. The data values within each data line are shifted (86) to center the peak amplitude of the data line at a preselected position to compensate for higher order motion. The set of angularly incremented data lines are reconstructed (96) into an image representation (98). In one embodiment, a plurality of the images are generated, each from data lines with their peak value shifted to a location which is offset by a fraction of a sample relative to the data lines which constructed the other images. Corresponding patches of these corresponding images are examined (110) for phase. Based on the examination, the one of the corresponding patches with the best image quality is transferred to a final image memory (114). In this manner, the final image is made up of the best patches of a plurality of corresponding images.

23 Claims, 5 Drawing Sheets

OTHER PUBLICATIONS

"Line Scan Diffusion Imaging", Gudjartsson, et al., MRM 36: 509–519 (1996).

"Use of a Projection Reconstruction Method to Decrease Motion Sensitivity in Diffusuin–Weighted MRI", Gmitro, et al., MRM 29:835–838 (1993).

"Theoretical and Experimental Evaluation of Phase–Dispersion Effects Caused Principles of Diffusion MRI and Spectroscopy, Chapter 2, Part IV, Diffusion MR Imaging: Echo–Planar Techniques", Turner, et al. pp. 50–55.

Diffusion and Perfusion Magnetic Resonance Imagining, Ed. LeBihan, 1995 Chapter 6, "Artifacts", pp. 103–110.

"Deblurring for Non–2D Fourier Transform Magnetic Resonance Imaging", Noll, et al, MRM 25: 319–333 (1992).

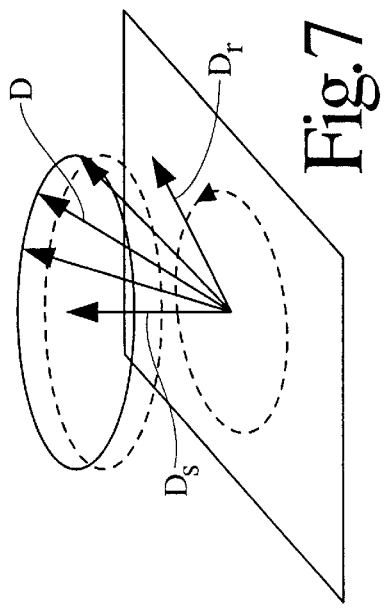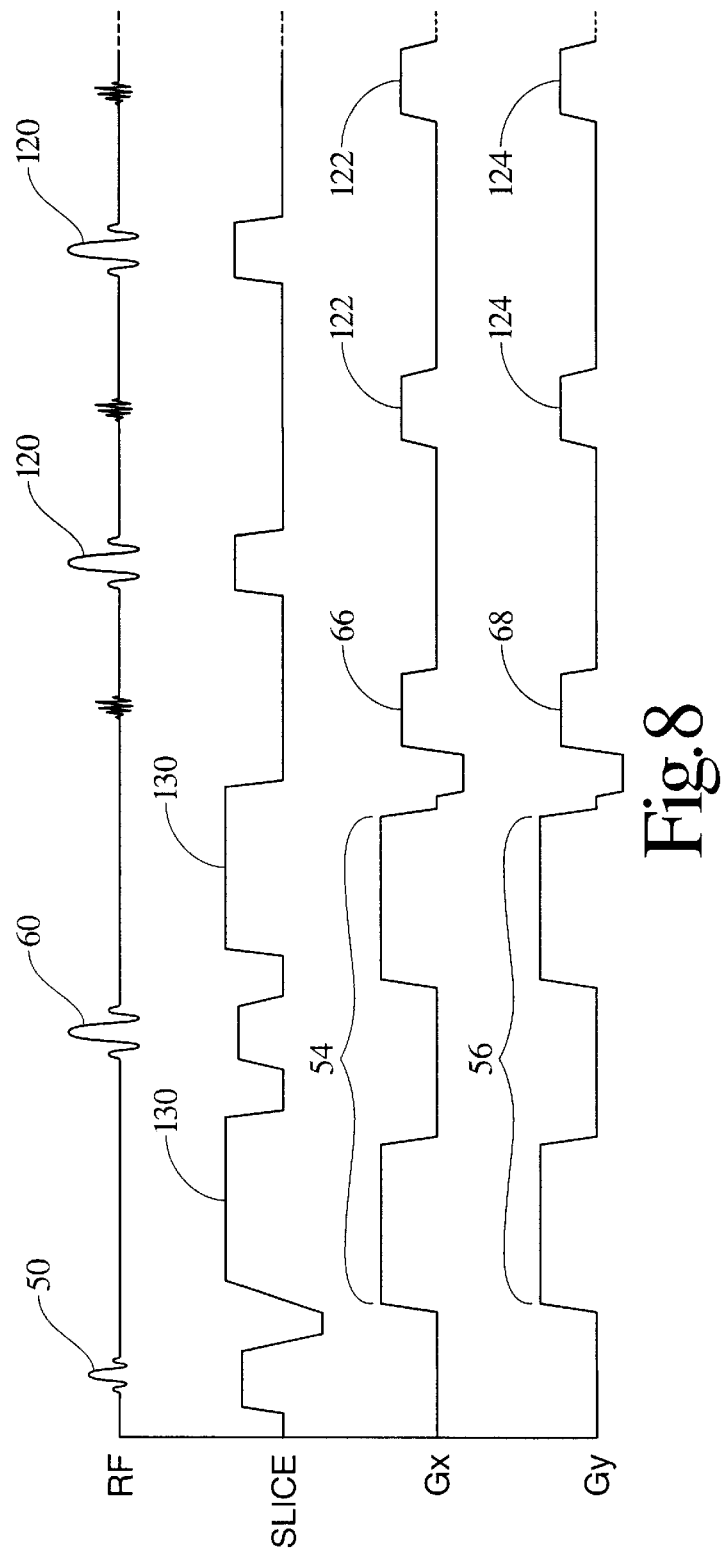

ROTATING DIFFUSION MR IMAGING REDUCED MOTION ARTIFACTS

BACKGROUND OF THE INVENTION

The present invention relates to the magnetic resonance imaging arts. It finds particular application in conjunction with images emphasizing diffusion and will be described with particular reference thereto.

Diffusion in biological systems yields various direct and indirect information. Water which diffuses in biological systems over distances on the order of 10 microns in a time of 10–100 milliseconds are imageable with magnetic resonance imaging techniques. In order to image diffusion, larger than normal gradients are applied, such that the diffusion provides a significant change in the magnetic resonance signal. In general, the more sensitive the image to diffusion, the larger the diffusion sensitizing gradient.

Some diffusion images are interpreted by comparing two or more images. Other diffusion images are diffusion direction sensitive such that a single image can be analyzed to generate meaningful diffusion information.

One of the problems with diffusion imaging is that the large gradients which encode the diffusion also induce a large sensitivity to patient motion. In living humans and animals, this high sensitivity to motion causes artifacts. For example, diffusion images of human medical patients routinely exhibit ghosting and other motion artifacts of such a magnitude that they can make the technique unreliable and unusable.

In one diffusion imaging technique, bipolar gradient waveforms are placed in an imaging sequence after the initial RF excitation and before the spatially encoded readout. When a spin echo is used, the diffusion sensitizing gradient typically has components placed on opposite sides of the 180° RF pulse. Because the spin system has its polarity inverted by the 1800 pulse, the components have a common polarity and are often referred to as "balanced" instead of bipolar. In other imaging sequences without a refocusing pulse, the components of the diffusion sensitizing gradient have opposite polarities.

One technique for minimizing the effects of bulk motion is to minimize the motion itself with mechanical constraints or by sedating or anesthetizing the patient. The effects of motion can also be reduced by synchronizing data collection with periodic physiological activity, such as cardiac gating, respiratory gating, and the like.

Constraining motion has several drawbacks. First, restricting the patient is often uncomfortable or physiologically unpleasant to the patient. The discomfort in some instances actually causes the patient to move more than if unrestrained. Gating requires additional complexity, and additional preparation of the patient. Moreover, gating restricts the choices of the sequence repeat time, slows data collection, and generally reduces the temporal efficiency of the acquisition. Sedation and anesthesia is not only inconvenient, but can be risky, expensive, and require additional professional personnel to be on hand for the exam. Moreover, these techniques are unlikely to help when the motions are not voluntary or periodic, such as swallowing or peristalsis.

Another method for reducing motion artifacts is to use very rapid readouts, particularly echo-planar readouts. In echo-planar imaging, there may be phase errors induced by the motion upon the readout signal, but these phase errors are typically uniform across the entire signal collection and across the entire image. One of the problems with echo-planar imaging is that the stringent gradient requirements can typically only be met by expensive, special purpose hardware. The high speed of echo-planar imaging also limits resolution. Echo-planar images are also subject to other artifacts such as spatial distortions from susceptibility changes.

Another approach is to acquire the signal with MR spatial imaging techniques which are intrinsically less sensitive to phase errors induced by bulk motion, for example, line scanning. Line scanning, however, has an intrinsic low signal-to-noise ratio. For medically useful images, an acceptable signal-to-noise ratio can often only be obtained at low spatial resolutions. Moreover, line scanning techniques are comparatively time inefficient, especially if several images of parallel slice positions are desired.

Other spatial encoding methods have a reduced dependency on signal phase or other parameters which may be corrupted by the combination of diffusion gradients and bulk motion. Projection reconstruction, for example, can be formulated to have less corruption from these errors than similar two-dimensional Fourier transform phase-encoding techniques. However, projection reconstruction as performed previously in the prior art only corrects for some bulk motion such as linear displacements, but not for other motions such as rotations, expanding and contracting movement, twisting movement, or the like.

Data acquisition might be rendered more temporally efficient with other readout methods, such as interleaved multi-shot echo-planar imaging. Because such scans are acquired in a substantially shorter time period, there is less time for patient motion. Patient cooperation tends to be improved for shorter imaging intervals. Moreover, rapid readout techniques may provide sufficient time for averaging to smooth artifacts. Of course, faster scans only reduce motion somewhat. Signal averaging may cause the appearance of ghosts to become more uniform and less highly peaked, but the intensity of the images is still incorrect. Errors which are smoother or which exhibit less structure are more difficult to recognize as errors. Faster scanning often compromises the signal-to-noise ratio, image contrast, or introduces unusually large dependencies upon motion.

Prior art techniques are available which use more sophisticated gradient waveforms to reduce or suppress sensitivity to certain forms of bulk motion such as velocity, acceleration, pulsatility, or the like. Some of these techniques may retain their sensitivity to diffusion. Unfortunately, motion compensated gradient waveforms have less diffusion sensitivity for a given gradient strength and echo time than would be obtained by other techniques. Moreover, the higher complexity and larger total area of the motion compensated diffusion weighted gradients may cause other technical difficulties such as increased eddy currents relative to the imaging gradients or diffusion gradients.

Another approach is to measure or estimate the patient motion and correct the acquired data for the measured motion. For example, in some techniques, additional readouts or navigator echoes are added to the other acquired data for the sole purpose of providing positional correction information. However, navigator echoes reduce scanning efficiency and may be complicated or very inconvenient to implement. They can only estimate and correct for some kinds of motion. In general, the more modes of motion to be monitored, the more navigator echoes that are required.

Further, the time at which the navigator echoes are acquired may be different and may exhibit different magnetic resonance signal evolution than the main signal, hence may give inaccurate estimates of the effect of motion on the main signal.

Stronger, shorter diffusion gradients tend to have less motion sensitivity, or at least less motion sensitivity relative to the amount of diffusion sensitivity. However, large, short gradients are difficult to apply. Expensive hardware would be required. Further, such large, short gradients may introduce problems such as biomedical side effects on the patient and are generally not an available option on existing magnetic resonance systems.

When the primary degrading motion is in regions of the image other than the region of interest, the artifacts may be reduced with a suppressing signal to those regions. For example, spatial presaturation or FLAIR may be utilized. Of course, such techniques are not helpful when there is significant motion-related error from the tissue of interest.

The technique of the present application provides for a practical collection of MR image data with significant sensitivity to diffusion, but which are largely insensitive to patient motion.

SUMMARY OF THE INVENTION

An accordance with one aspect of the present invention, a method of magnetic resonance imaging is provided. Magnetic resonance is excited and then read out along a plurality of read out directions to generate a plurality of data lines. The read out data lines are rotated about the origin such that the data lines are collected at each of a plurality of angularly incremented, rotated orientations about an origin. The data lines are reconstructed into an image representation. Prior to collecting each data line, balanced diffusion sensitizing gradient pulses are applied to sensitize for diffusive motion in a direction orthogonal to the data line direction. In this manner, sensitivity to diffusion is perpendicular to the data line and rotates around the origin with the data line orientations.

In accordance with another aspect of the present invention, a method of generating diffusion sensitive images is provided. Magnetic resonance is excited in a slice or slab. Balanced diffusion sensitizing gradient pulses are applied to sensitize the magnetic resonance to diffusion along a selected diffusion sensitization direction. A read gradient is applied to frequency encode the magnetic resonance along a read direction, the read direction being orthogonal to the diffusion direction. A data line of magnetic resonance data is read out during application of the read gradient. The preceding steps are repeated with the diffusion sensitizing and read out directions rotated by common angles to read out a plurality of data lines which are angularly rotated relative to each other. The plurality of data lines is reconstructed into an image representation.

In accordance with a more limited aspect of the invention, first and second balanced diffusion sensitizing gradient pulses are applied on each of two axes within the slice or slab. First and second read gradient components are also applied on the two orthogonal axes. The first and second read gradient components are weighted by $\sin\theta$ and $\cos\theta$, respectively, and the balanced diffusion sensitize gradient pulses are weighted by $\sin(\theta+\pi/2)$ and $\cos(\theta+\pi/2)$, respectively.

In accordance with another more limited aspect of the present invention, a location of a peak magnitude of each read out data line is determined. The data of the data line is shifted such that the peak magnitude location is shifted to a preselected location within each data line.

In accordance with another more limited aspect of the present invention, a phase of each data line is determined at a preselected location along the data line. The phase of each data line is adjusted in accordance with a difference between the determined phase and a preselected phase.

In accordance with another aspect of the present invention, a magnetic resonance imaging system is provided. A magnet generates a temporally constant magnetic field through an examination region. A radio frequency pulse controller and transmitter induces dipoles in the examination region to resonance such that radio frequency resonance signals are generated. Magnetic field gradient coils and a gradient magnetic field controller generate slice or slab select, read, and diffusion sensitizing gradient pulses across the examination region. A receiver receives and demodulates radio frequency magnetic signals read out during the read gradients to produce a series of data lines. A reconstruction processor reconstructs the data lines into an image representation. An image memory stores the reconstructed image representation. A means is provided for rotating the read and diffusion sensitizing gradients such that the diffusion sensitivity and the read out directions are angularly incremented around an origin.

A primary advantage of the present invention resides in its improved immunity to motion, including rotational motion, acceleration, and other higher order motions.

Another advantage of the present invention is that it can be performed with conventional magnetic resonance imaging equipment without the addition of special hardware.

Another advantage of the present invention resides in its reduced dependence on the directionality of the diffusion.

Other advantages of the present invention include a good signal-to-noise ratio, high resolution, and efficient scan time.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 7 illustrates three-dimensional diffusion sensitization; and,

FIG. 8 illustrates an exemplary spin echo sequence with three-dimensional diffusion sensitivity.

DETAILED DESCRIPTION OF THE PREFERRED EMBODIMENTS

Figure 1:
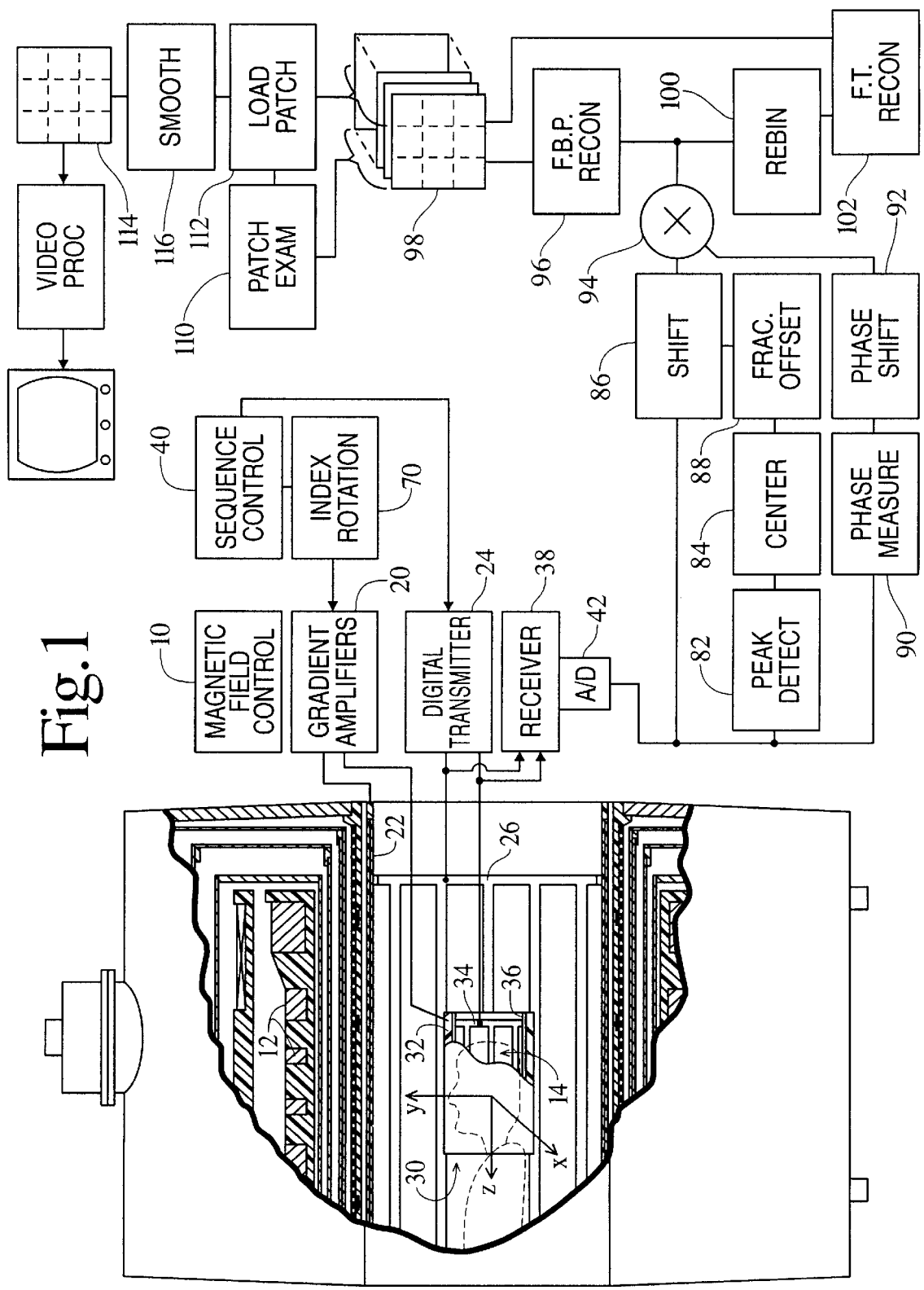
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38, preferably a digital receiver.

A sequence control circuit 40 controls the gradient pulse amplifiers 20 and the transmitter 24 to generate any of a plurality of multiple echo sequences, such as echo-planar imaging, echo-volume imaging, gradient and spin echo imaging, fast spin echo imaging, and the like. For the selected sequence, the receiver 38 receives a plurality of data lines in rapid succession following each RF excitation pulse. An analog-to-digital converter 42 converts each data line to a digital format. The analog-to-digital converter can be disposed between the radio frequency receiving coil and the receiver for digital receivers or downstream from an analog receiver.

Figure 2:
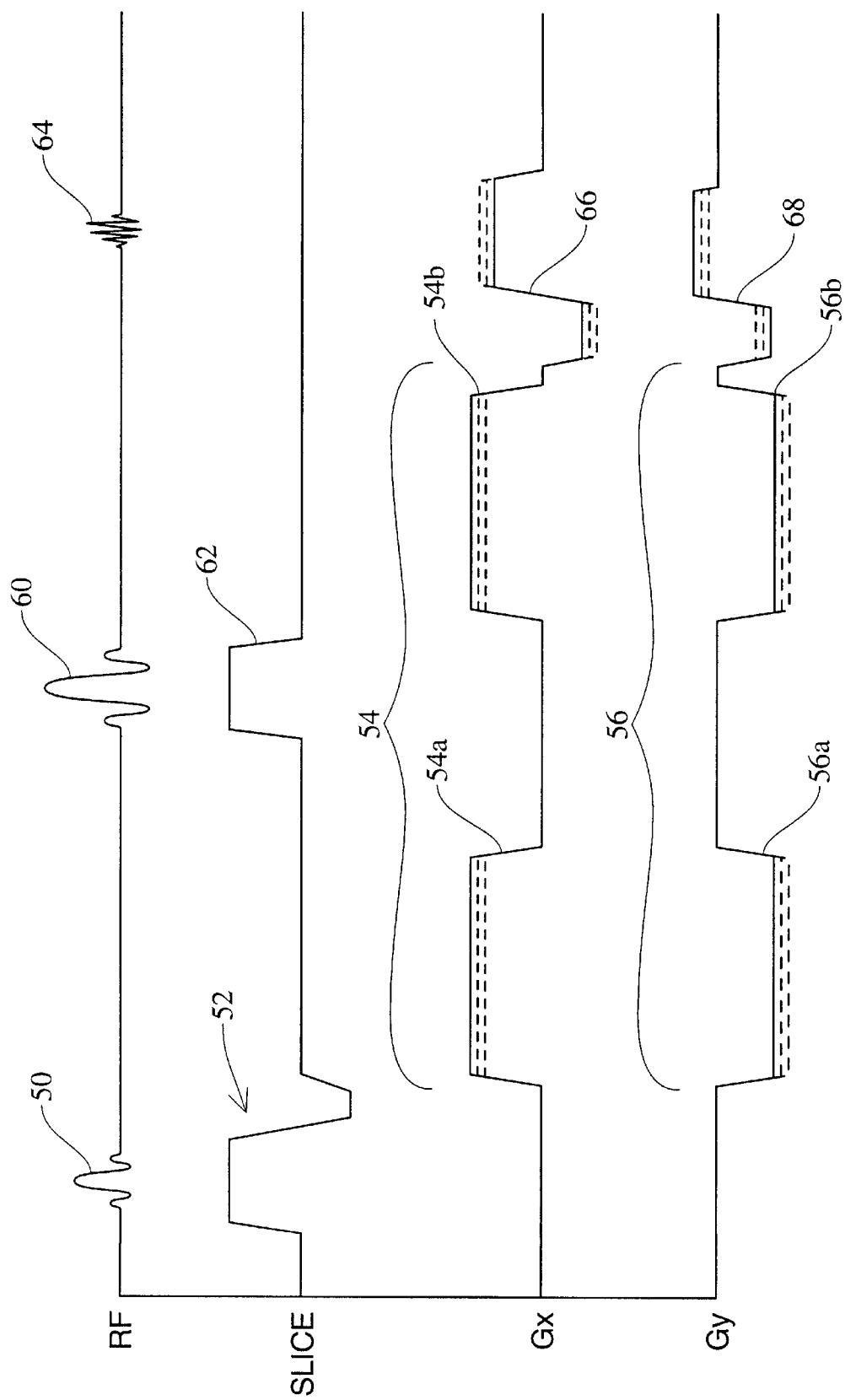
FIG. 2 illustrates an exemplary spin echo imaging sequence in accordance with the present invention.

With continuing reference to FIG. 1 and further reference to FIG. 2, a rotation, backprojection imaging sequence is implemented by the sequence control 40 in which the data acquisition line is rotated in steps about the center of k-space. More specifically, an RF excitation pulse 50, a 90° pulse in the illustrated spin-echo embodiment, is applied concurrently with a slice select gradient 52. The first portions 54a, 56a of a pair of balanced diffusion sensitizing gradients 54, 56 are applied along gradient axes $G_x$, $G_y$ which are orthogonal to each other and the slice select axis. An RF refocusing pulse 60 is applied concurrently with another slice select pulse 62. Second portions 54b, 56b of the balanced diffusion sensitizing pulses 54, 56 are then applied. Due to the 180° inversion pulse, the corresponding first and second pulse portions along each axis effectively have the opposite polarity from each other. Of course, the bipolar diffusion sensitizing pulses are analogously applied with non-spin-echo sequences as well. The resonance excitation and inversion pulses induce a magnetic resonance echo 64. A pair of read gradient pulses 66, 68 are applied concurrently with the echo.

Figure 3:
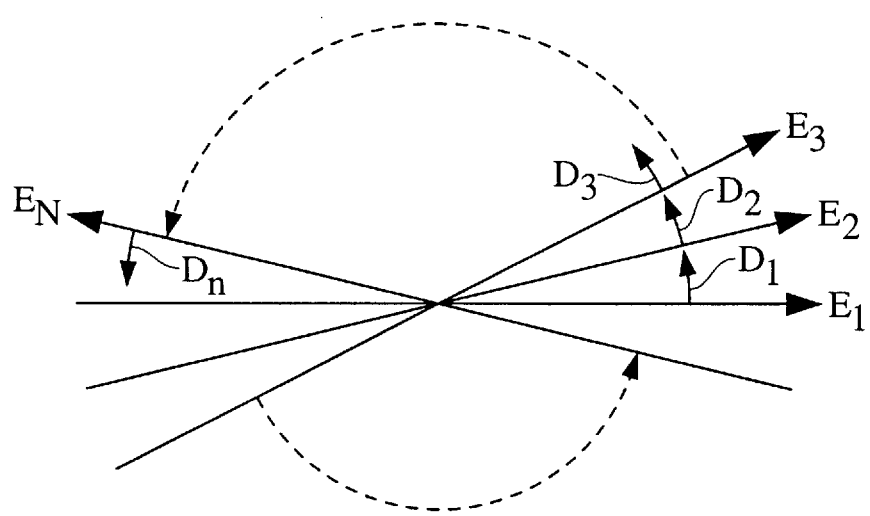
FIG. 3 illustrates the filling of k-space and the vector direction of maximum diffusion sensitivity.

With particular reference to FIG. 3, the sequence control 40 includes an angle indexing means 70 which scales the read gradients 66, 68 on read gradient axes $G_x$ and $G_y$ as $\cos\theta$ and $\sin\theta$, respectively, in each repetition. In this manner, the direction along which the data is collected rotates about an origin in k-space. The $\cos\theta$ and $\sin\theta$ scaling of course, causes one of the read gradients to shrink as the other grows, with the magnitude of the combined vector gradient $G_x\hat{X}+G_y\hat{Y}$ remaining substantially constant. The angle indexing means 70 also indexes the balanced diffusion gradients such that the direction of maximum diffusion sensitivity is perpendicular to the direction of data collection in k-space, i.e., the first diffusion sensitizing gradient pulse 54 and the second balanced diffusion sensitizing pulse 56 are also scaled, but as $\cos(\theta+\pi/2)$ and $\sin(\theta+\pi/2)$, respectively. In this manner, both the direction of the data line in k-space and the direction of maximum diffusion sensitivity of the sequence are rotated in increments to remain orthogonal to each other.

Figure 4:
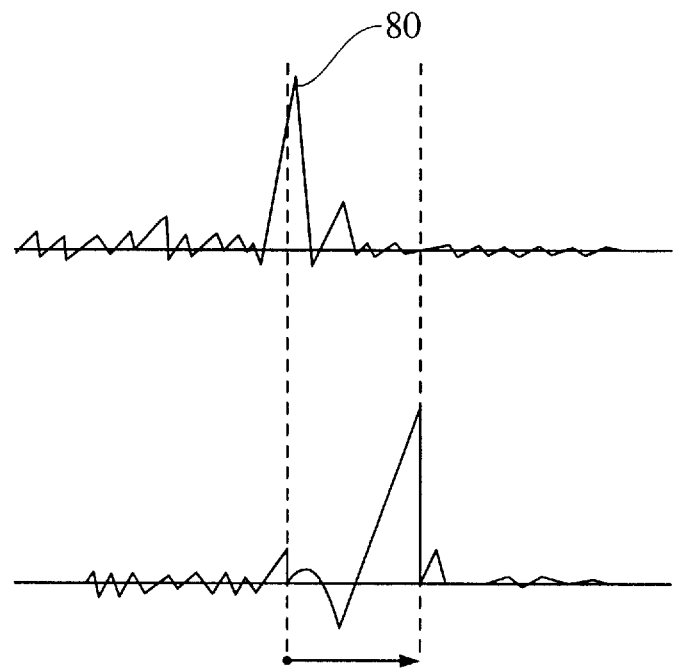
FIG. 4 illustrates a rotational movement induced shift of the data line in k-space.

With reference again to FIG. 1 and further reference to FIG. 4, with the large balanced diffusion sensitizing gradients and no movement, the data line tends to have a peak 80 at the center of k-space where it crosses the zero phase-encode data line. Perfectly linear movement, (i.e., rigid body translational displacements) adds a constant phase error $e^{-i\alpha}$ to the entire data line. Rotational patient movement, particularly in-plane rotations, cause the data line to shift along the data collection trajectory of k-space.

With reference again to FIG. 1, as each digital data line is received from the receiver 38 and analog-to-digital converter 42, it is passed to a peak detector 82. The peak detector determines the peak of each data line. A centering system 84 determines the difference between the location of the determined peak of the data line and a reference center. The reference center point is selected for mathematical convenience in the reconstruction process. Alternately, the reference data line may be a data line collected without the diffusion gradients. A data shifting processor 86 shifts each data line by the determined difference or offset. Of course, because the data is digital and sampled, the offset is typically measured and shifted in amounts corresponding to one sample. Shifts of the data more accurate than a discrete sample incorporate interpolation methods. A fractional offset adder 88 optionally adds further offset to the shift as is explained in more detail below.

A phase measurement circuit 90 measures the phase at a preselected location along the data line, preferably at the peak. A phase shift determining circuit 92 determines the difference between the measured phase and the phase of the reference data line. A complex multiplier 94 makes the determined phase shift to the centered data line. A filtered backprojection reconstruction processor 96 reconstructs a set of data lines into an image representation of the selected slice which is stored in one plane of an image memory 98. Optionally, other reconstruction techniques may be utilized, operating either directly on the rotated data lines or a rebinning circuit 100 can be used to rearrange the points along the radially arranged data lines into sets of parallel data lines. The rebinned parallel data lines are reconstructed 102 using conventional reconstruction techniques for parallel data lines, such as a two-dimensional Fourier transform reconstruction technique.

A correction for susceptibility errors is preferably made, especially if only 180° of projections are acquired. The position of the RF spin echo is shifted in time relative to the time when the acquired data echo forms, i.e., the center of k-space. Any data which is off resonance exhibits a phase shift which is proportional to the frequency shift error. In the preferred embodiment, the data for a single slice is reconstructed with no fractional offset added by the fractional offset circuit 88 and again with a plurality of other fraction of a pixel offsets and the resultant slice image stored in another plane of the image memory 98. That is, an image is generated with each data line peak centered at the reference center. Another image is generated with the data line peak shifted to the central reference sample but offset from the reference center by the equivalent of a fraction of a sample, e.g., 0.3. Other images which have their centers spanning the center sample in increments, e.g., an image at 0 offset, an image at +0.3 offset, an image at −0.3 offset, at +0.6, at −0.6, at +0.9, and at −0.9.

Each reconstructed image is divided into the same plurality of segments or patches. A patch examining means 110 examines the corresponding patch in each of the plurality of images of the same slice to determine which is in the best focus or otherwise has the best image quality. In the preferred embodiment, the focus checking circuit 110 reads the phase at a preselected, preferably center pixel of each region or patch. The phase map is used to determine which of the corrected offset images is most accurate to use at any given pixel location. Optionally, phase shift at several pixels can be measured and averaged. Once the circuit 110 determines which patch has the least phase error or is for other reasons the best quality diagnostic image, a data loading circuit 112 loads the data from that patch into a blended image memory 114. Preferably, a smoothing circuit 116 smooths the interface between adjacent patches. For example, each patch can overlap adjacent patches by a preselected number of pixels. The patch edge smoothing circuit performs a weighted averaging of the overlapping pixels.

Various alternate embodiments immediately suggest themselves. For example, rather than rotating the read gradient by 180°, the read gradient can be swept a full 360° to average the data.

Figure 5:
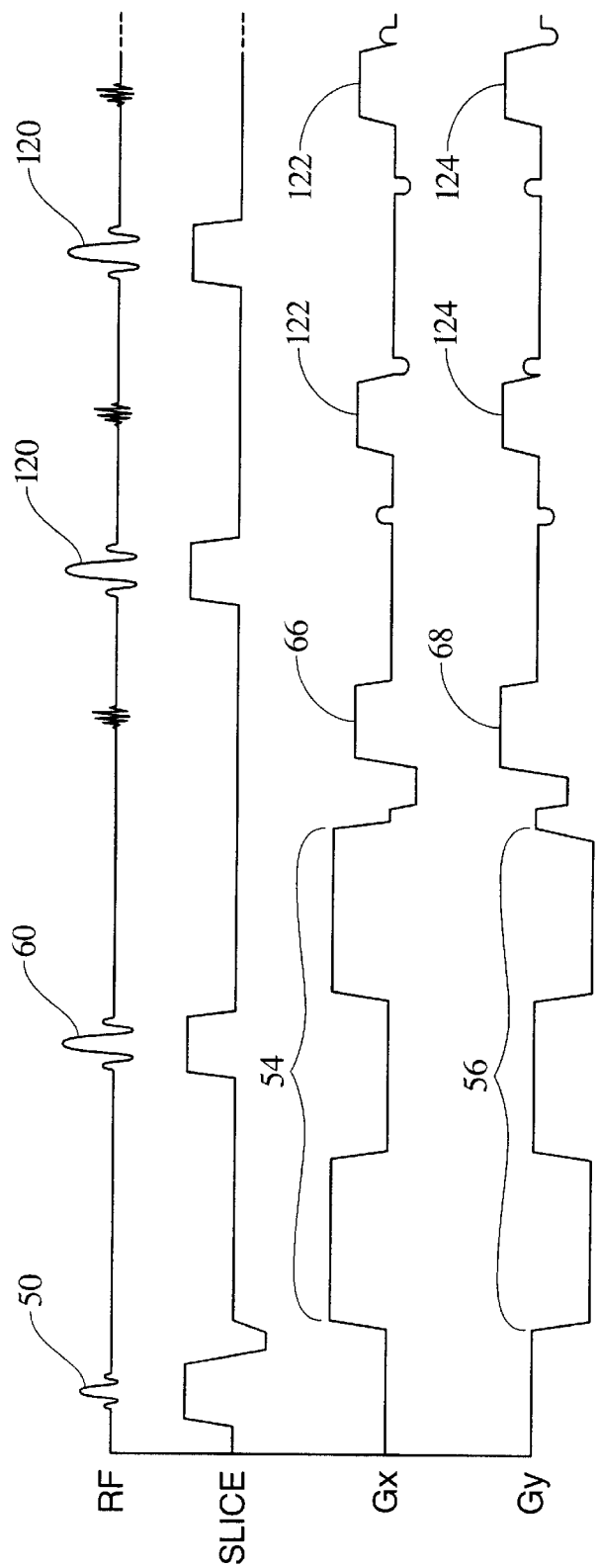
FIG. 5 illustrates an exemplary fast spin echo sequence.

With reference to FIG. 5, a plurality of additional RF refocusing pulses 120, and read gradients 122, 124 are applied following each excitation for shorter data acquisition times. Each time the read gradients are applied, they are rotated or indexed with the sin/cos relationship discussed above. With this fast spin-echo type sequence, multiple, angularly offset data lines are generated in each repetition.

Figure 6C:
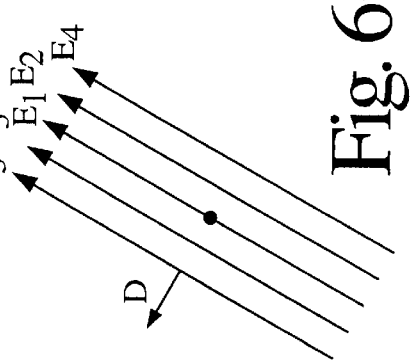
FIGS. 6A, 6B, and 6C illustrate the collection of data lines in rotated rectangular swaths.
Figure 6B:
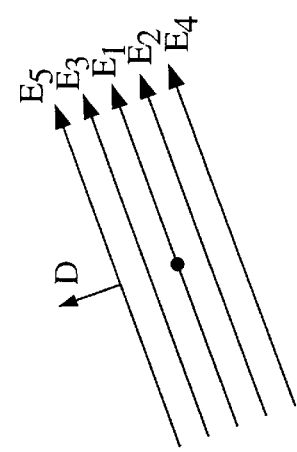
Figure 6A:
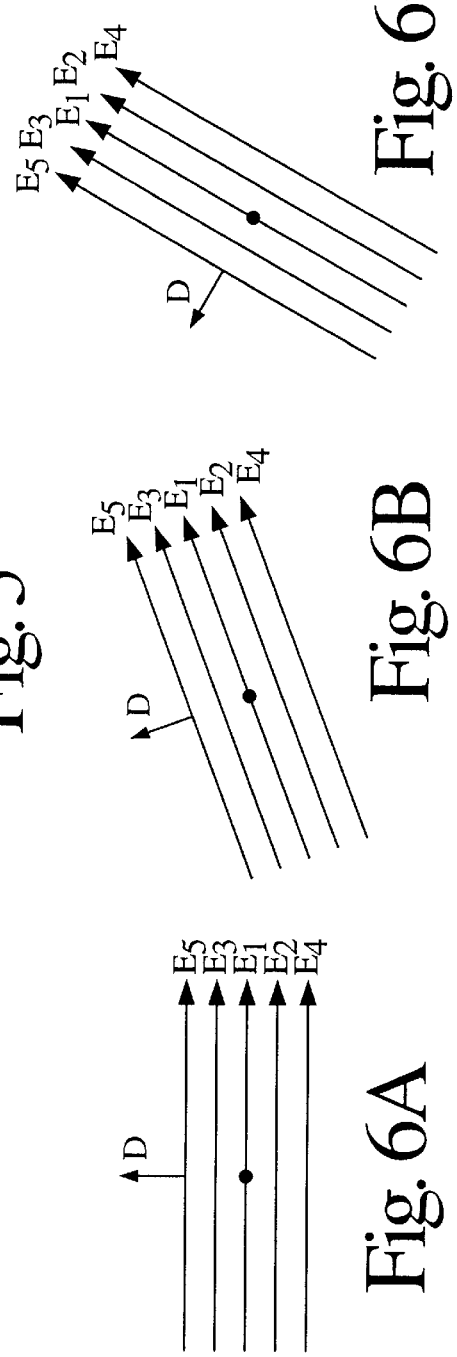

With reference to FIGS. 6A, 6B, and 6C, the data lines collected following each excitation are alternately parallel to each other to generate a small set of parallel data lines. The read gradients of FIG. 5 are scaled linearly following each refocusing pulse. In this manner, a plurality of sets of angularly displaced parallel data lines are generated. These data lines are regridded and reconstructed as described above.

As another alternative, rather than using a spin-echo, the data can also be collected after a stimulated echo, particularly where long echo times are desired to gain significant diffusion weighting.

This technique can also be used in conjunction with fat saturation. The signal from fat is significantly off-resonance from water. The use of fat saturation inhibits the artifacts which the off-resonance fat tissue tends to cause during projection reconstruction.

Of course, this technique is also applicable to multi-slice imaging, as well as slab or volume imaging. In slab and volume imaging a phase-encode gradient is applied along the slice select gradient direction to provide encoding along the third dimension.

Unlike most diffusion imaging techniques in which the diffusion vector is in the same direction for all data lines, the present technique rotates the direction of the vector of maximum diffusion sensitivity. In this manner, the technique images diffusion in multiple directions.

With reference to FIG. 7, the diffusion gradient direction D has a rotating component $D_r$ in the plane of the data line, and an orthogonal component $D_s$ in the slice select direction. With reference to FIG. 8, the component in the slice select direction, achieved by adding a diffusion sensitizing pulse 130 along the slice select axes, encodes the diffusion along a third direction. Because diffusion sensitivity is provided now with components both in plane perpendicular to the data line and components perpendicular to the slice, the diffusion gradient sweeps out a cone. Preferably, the strength of the diffusion gradient along the slice select direction is $1/\sqrt{2}$ of the strength of the diffusion gradient in the in plane direction to provide an approximately equal diffusion weighting along all three principal axes on average. In this manner, independent diffusion information is generated as would normally be generated by calculating a tensor trace image from three independently acquired diffusion images, each primarily sensitive to diffusion along a different one of three orthogonal axes.

Many biological structures are known a priori to have a structure which orients diffusion substantially along a single direction. For example, some biological structures function as a series of parallel tubes with significant diffusion axially and reduced diffusion across their barriers. In such tissue, it is preferred that the slice select direction be selected such that it runs parallel to the main diffusion orientation of the fibers. One image parallel to the tissue orientation and one image with diffusion sensitivity perpendicular to the tissue orientation are acquired to produce a pair of images which fully describe the anisotropy of the diffusion.

In another alternate embodiment, two images are acquired, one with the diffusion rotating in plane and the other sensitized along the slice select direction. By combining these two images, the resultant image is substantially free of directional dependence. Of course, an appropriate weighting between the two images should be made.

As another alternative, each of the collected data lines is converted to a projection, preferably by a Fourier transform. Such a magnitude-only data line needs no phase correction or even positioning. These magnitude projections are then reconstructed, preferably by convolution backprojection into the resultant image.

Numerous other trajectories through k-space are also contemplated. The series of trajectories may move through k-space in two or three dimensions in any of a multiplicity of simple or elaborate schemes, with the diffusion vector perpendicular to the k-space trajectory. The technique may also be used with inherently 3D data that is collected with all projections. The diffusion direction is varied such that it is perpendicular to each readout direction.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

We claim:

1. In a method of magnetic resonance imaging in which magnetic resonance is excited and read out along a plurality of read out directions to generate a plurality of data lines, the read out directions being rotated about an origin such that the data lines are collected at each of a plurality of angularly incremented, rotated read out directions around the origin, the data lines being reconstructed into an image representation, the improvement comprising:

prior to collecting each data line, applying diffusion sensitizing gradient pulses to sensitize for diffusion flow in a direction transverse to the read out direction of the data line to be next collected such that during the collection of the data line sensitivity to diffusion is transverse to the collected data line and such that the sensitivity to diffusion is rotated around the origin concurrently with the rotation of the read out direction.

2. A method of generating diffusion sensitive images, the method comprising:

(a) exciting magnetic resonance in a slice or slab;

(b) applying diffusion sensitizing gradient pulses to sensitize the excited magnetic resonance to diffusion along a selected diffusion sensitization direction;

(c) applying a read gradient to frequency encode the magnetic resonance along a read direction, the read direction being orthogonal to the diffusion direction;

(d) reading out a data line of magnetic resonance data during application of the read gradient;

(e) repeating steps (a)–(d) with the diffusion sensitization and read out directions both rotated by a common angle to read out a plurality of data lines which are angularly rotated relative to each other, each data line being read out in a read direction orthogonal to the diffusion sensitization direction of the immediately preceding diffusion sensitizing gradient pulse;

(f) reconstructing the plurality of data lines into an image representation.

3. A method of generating diffusion sensitive images, the method comprising:

(a) exciting magnetic resonance in a slice or slab;

(b) applying first and second sets of diffusion sensitizing gradient pulses on each of two orthogonal axes within the slice or slab to sensitize the excited magnetic resonance to diffusion along selected diffusion sensitization directions;

(c) applying first and second read gradient components of a read gradient on each of the two orthogonal axes to frequency encode the magnetic resonance alone read directions, the read direction being orthogonal to the diffusion direction;

(d) reading out a data line of magnetic resonance data during application of the read gradient;

(e) repeating steps (a)–(d) with the diffusion sensitization and read directions rotated by an angle θ relative to a preselected reference direction to read out a plurality of data lines which are angularly rotated relative to each other by (i) weighting the first read gradient component by sinθ and the second read gradient component by cosθ and (ii) weighting the first set of diffusion sensitizing gradient pulses by sin(θ+π/2) and the second set of diffusion sensitizing gradient pulses by cos(θ+π/2); and (f) reconstructing the plurality of data lines into an image representation.

4. The method as set forth in claim 3 wherein the step of applying the diffusion sensitizing gradient pulses further includes applying a third set of diffusion sensitizing gradient pulses to sensitize for diffusion in a direction perpendicular to the plane of the slice.

5. A method of generating diffusion sensitive images, the method comprising:

(a) exciting magnetic resonance in a slice or slab;

(b) applying diffusion sensitizing gradient pulses to sensitize the excited magnetic resonance to diffusion along a selected diffusion sensitization direction;

(c) applying a read gradient to frequency encode the magnetic resonance along a read direction, the read direction being transverse to the diffusion direction;

(d) reading out a data line of magnetic resonance data during application of the read gradient;

(e) determining a location of a peak magnitude of the read out data line;

(f) shifting the data line such that the location of peak magnitude is at a preselected location within the data line;

(g) repeating steps (a)–(f) with the diffusion sensitization and read out directions rotated by common angles to read out a plurality of data lines in which the read out directions and the diffusion sensitization directions are angularly rotated relative to previous data lines;

(h) reconstructing the plurality of data lines into an image representation.

6. The method as set forth in claim 5 further including:

determining a phase of each data line at a preselected location along the data line;

determining a difference between the determined phase and a preselected phase;

adjusting the phase of each data value of the data line by the determined difference.

7. The method as set forth in claim 6 wherein the phase of each data line is determined at the location of peak magnitude.

8. The method as set forth in claim 5 further including:

collecting a plurality of sets of data lines, for each set of data lines;

in the step of shifting the location of peak magnitude to a preselected location, the data lines of each set are shifted to a different preselected location, which different preselected locations vary from each other by a distance corresponding to a fraction of a sample, the plurality of data lines of each set being reconstructed into separate images.

9. A method of generating diffusion sensitive images, the method comprising:

(a) exciting magnetic resonance in a slice or slab;

(b) applying diffusion sensitizing gradient pulses to sensitize the excited magnetic resonance to diffusion along a selected diffusion sensitization direction;

(c) applying a read gradient to frequency encode the magnetic resonance along a read direction, the read direction being orthogonal to the diffusion direction;

(d) collecting a plurality of sets of data lines by reading out a data line of magnetic resonance data during application of the read gradient, determining a location of a peak magnitude of the read out data line, and shifting the data line such that the location of peak magnitude is at a preselected location within the data line, the data lines of each set being shifted to a different preselected location, which different preselected locations vary from each other by a distance corresponding to a fraction of a sample, then reconstructing the plurality of data lines of each set into separate images;

(e) repeating steps (a)–(d) with the diffusion sensitization and read out directions rotated to each of a plurality of angles to read out a plurality of sets of data lines which are angularly rotated relative to each other;

(f) reconstructing the data lines shifted to different locations into separate images;

(g) examining each of a plurality of corresponding patches of the separate images to determine which of the corresponding patches has a preferred image quality; and, (h) splicing the patches with the preferred image quality together to derive a resultant image.

10. The method as set forth in claim 2 further including:
determining a phase of each data line at a preselected location along the data line;
determining a difference between the determined phase and a preselected phase;
adjusting the phase of each data value of the data line by the determined difference.

11. The method as set forth in claim 2 further including:
applying a refocusing radio frequency pulse between lobes of the diffusion sensitizing gradient pulses to induce a spin echo and applying the read gradient concurrently with the spin echo.

12. A method of generating diffusion sensitive images the method comprising:

(a) exciting magnetic resonance in a slice or slab by applying an excitation pulse and applying a slice or slab select gradient concurrently with the excitation pulse, the slice or slab select gradient being applied parallel to a slice select axis such that resonance is excited in a selected slice or slab;

(b) applying diffusion sensitizing gradient pulses (i) along the slice select axis, (ii) along a first axis perpendicular to the slice select axis, and (iii) along a second axis perpendicular to the slice select and first axes to sensitize the excited magnetic resonance to diffusion along a selected diffusion sensitization direction;

(c) applying read gradients along the first and second axes;

(d) reading out a data line of magnetic resonance data during application of the read gradient;

(e) repeating steps (a)–(d) with the diffusion sensitization and read out directions rotated, such that the direction of diffusion sensitization rotates along a cone to read out a plurality of data lines which are angularly rotated relative to each other;

(f) reconstructing the plurality of data lines into an image representation.

13. A method of generating diffusion sensitive images, the method comprising:

(a) exciting magnetic resonance in a slice or slab;

(b) applying diffusion sensitizing gradient pulses to sensitize the excited magnetic resonance to diffusion along a selected diffusion sensitization direction;

(c) applying a read gradient to frequency encode the magnetic resonance along a read direction, the read direction being offset from the diffusion direction;

(d) reading out a data line of magnetic resonance data during application of the read gradient;

(e) refocusing the excited magnetic resonance to induce additional echoes;

(f) applying additional diffusion sensitizing gradient pulses to rotate the diffusion sensitization direction;

(g) applying a read gradient during each echo, the read gradients being scaled to rotate the read direction from echo to echo;

(h) reading out another data line during each echo;

(i) repeating steps (a)–(h) with the diffusion sensitization and read out directions rotated from echo to echo to read out a plurality of data lines which are angularly rotated relative to each other;

(j) reconstructing the plurality of data lines into an image representation.

14. The method as set forth in claim 2 further including after step (d):
inducing additional echoes;
applying a read gradient during each echo, the read gradients being scaled to rotate the read direction from echo to echo;
reading out another data line during each echo, the read gradients being scaled to offset the data line parallel to the read direction from echo to echo.

15. In a magnetic resonance imaging system which includes a magnet for generating a temporally constant magnetic field through an examination region, a radio frequency pulse controller and a transmitter for inducing dipoles in the examination region to resonance such that radio frequency resonance signals are generated, magnetic field gradient coils and a gradient magnetic field controller for generating slice or slab select, read, and diffusion sensitizing gradient pulses across the examination region, a receiver for receiving and demodulating radio frequency magnetic signals read out during the read gradients to produce a series of data lines, a reconstruction processor for reconstructing the data lines into an image representation, and an image memory for storing the reconstructed image representation, the improvement comprising:

a means for angularly stepping both the read and diffusion sensitizing gradients around an origin such that diffusion sensitivity directions and corresponding read out directions of the data lines which are reconstructed into one image representation are both angularly incremented by the same angular increment about the origin.

16. A magnetic resonance imaging system which includes a magnet for generating a temporally constant magnetic field through an examination region, a radio frequency pulse controller and a transmitter for inducing dipoles in the examination region to resonance such that radio frequency resonance signals are generated, magnetic field gradient coils and a gradient magnetic field controller for generating slice or slab select, read, and diffusion sensitizing gradient pulses across the examination region, a receiver for receiving and demodulating radio frequency magnetic signals read out during the read gradients to produce a series of data lines, a reconstruction processor for reconstructing the data lines into an image representation, and an image memory for storing the reconstructed image representation, and further comprising:

a means for rotating the read and diffusion sensitizing gradients such that the diffusion sensitivity and the read out direction of the data lines are angularly incremented about an origin;

a peak detector for detecting a location of maximum amplitude of each data line; and a data line centering means connected with the peak detector for shifting data values along the data line such that the detected peak value is at a preselected location along the data line.

17. The magnetic resonance imaging system as set forth in claim 16 further including:

a fractional offset means for further shifting the location of the detected peak value by a distance corresponding to a selected fraction of a sample.

18. The magnetic resonance imaging system as set forth in claim 17 wherein the image memory has a plurality of memory planes, each memory plane storing a reconstructed image with a different fractional offset applied by the fractional offset means and further including:

a means for examining at least one preselected data value in each of a preselected plurality of corresponding patches of the plurality of images to determine a phase at the selected pixel;

a means for selecting based on the determined phase one of the corresponding patches for inclusion in a final image;

a means for merging each of the selected patches into a final image memory to produce the final image.

19. The magnetic resonance imaging system as set forth in claim 16 further including:

a means for measuring a difference between a phase of data at a preselected location along the data line relative to the detected peak;

a means for determining a phase shift between the measured phase and a preselected phase; and, a means for phase shifting the phase of each data line by the determined phase shift.

20. A magnetic resonance imaging system comprising:

a magnet for generating a temporally constant magnetic field through an examination region;

a radio frequency pulse controller and a transmitter for inducing dipoles in the examination region to resonance such that radio frequency resonance signals are generated;

magnetic field gradient coils and a gradient magnetic field controller for generating slice or slab select, read, and diffusion sensitizing gradient pulses across the examination region;

a means for rotating the read and diffusion sensitizing gradients such that the diffusion sensitivity and the read out direction of the data lines which are reconstructed are angularly incremented about an origin;

a receiver for receiving and demodulating radio frequency magnetic signals read out during the read gradients to produce a series of data lines;

a reconstruction processor for reconstructing the data lines into an image representation, the reconstruction process including:

a means for rebinning data values of the angularly offset data lines to approximate parallel data lines; and, a two-dimensional Fourier transform means for performing a two-dimensional Fourier transform on the parallel data lines;

and an image memory for storing the reconstructed image representation.

21. The method as set forth in claim 1, wherein each of the plurality of data lines are collected along a linear path, which linear paths are angularly incremented about the origin to rotate the read out direction.

22. The method as set forth in claim 2, wherein the plurality of data lines are collected along angularly indexed linear paths.

23. The method as set forth in claim 20, wherein the data lines are each collected along a linear path.

* * * * *